US012774518B2

(12) United States Patent
Zhu et al.

(10) Patent No.: US 12,774,518 B2
(45) Date of Patent: Oct. 27, 2026

(54) METHOD FOR FORMING HIGH DENSITY CARBON FILMS WITH REDUCED SUBSTRATE BACKSIDE DAMAGE

(71) Applicant: Applied Materials, Inc., Santa Clara, CA (US)

(72) Inventors: Dan Zhu, Santa Clara, CA (US); Thilini Ekanayaka, Santa Clara, CA (US); Ruiyun Huang, Santa Clara, CA (US); Yuxing Zhang, Santa Clara, CA (US); Jun Feng, Santa Clara, CA (US); Abhijit Kangude, Fremont, CA (US); Xinhai Han, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1 day.

(21) Appl. No.: 18/736,802

(22) Filed: Jun. 7, 2024

(65) Prior Publication Data

US 2025/0376761 A1 Dec. 11, 2025

(51) Int. Cl.

| | |
|---|---|
| ***C23C 16/26*** | (2006.01) |
| ***C23C 16/455*** | (2006.01) |
| ***C23C 16/509*** | (2006.01) |
| ***C23C 16/52*** | (2006.01) |
| ***C23C 16/56*** | (2006.01) |

(52) U.S. Cl.

CPC ........ *C23C 16/26* (2013.01); *C23C 16/45502* (2013.01); *C23C 16/509* (2013.01); *C23C 16/52* (2013.01); *C23C 16/56* (2013.01)

(58) Field of Classification Search

CPC . C23C 16/26; C23C 16/45502; C23C 16/509; C23C 16/52; C23C 16/56

See application file for complete search history.

(56) References Cited

U.S. PATENT DOCUMENTS

| | | | | |
|---|---|---|---|---|
| 2016/0225588 | A1 | 8/2016 | Shaikh et al. | |
| 2018/0033622 | A1 * | 2/2018 | Swaminathan | ..... H01L 21/0228 |
| 2022/0282366 | A1 | 9/2022 | Weimer et al. | |
| 2024/0136153 | A1 | 4/2024 | Weimer et al. | |

FOREIGN PATENT DOCUMENTS

| | | | |
|---|---|---|---|
| JP | 2022097936 | A | 7/2022 |
| KR | 20210066936 | A | 6/2021 |

OTHER PUBLICATIONS

International Search Report and Written Opinion in related application PCT/2025/032404 dated Sep. 30, 2025.

* cited by examiner

*Primary Examiner* — Michael G Miller

(74) *Attorney, Agent, or Firm* — Patterson + Sheridan, LLP

(57) ABSTRACT

In an embodiment, a method for processing a substrate is provided. The method includes flowing a processing gas comprising a hydrocarbon precursor gas into a processing volume of a process chamber, heating and maintaining the substrate support at a processing temperature of less than about 450° C., applying a dual radio frequency (RF) power to generate a deposition plasma for depositing a carbon film on the substrate, and performing an annealing process to anneal the carbon film deposited on the substrate.

20 Claims, 4 Drawing Sheets

METHOD FOR FORMING HIGH DENSITY CARBON FILMS WITH REDUCED SUBSTRATE BACKSIDE DAMAGE

BACKGROUND

Field

Embodiments of the present disclosure generally relate to the fabrication of integrated circuits. More particularly, the embodiments described herein provide techniques for deposition of high density amorphous carbon films on a substrate with reduced and/or minimal substrate backside damage.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, low resistivity conductive materials as well as low dielectric constant insulating materials are used to obtain suitable electrical performance from such components.

The demands for greater integrated circuit densities also impose demands on the process sequences used in the manufacture of integrated circuit components. For example, in process sequences that use conventional photolithographic techniques, carbon hardmasks formed of amorphous carbon are used as an etching mask in forming features (e.g., high aspect ratio openings) in a substrate surface or in a material surface layer thereof. During etching, the example hardmask provides selective resistance to the etchants used to form the features. Hardmask materials having both high etch selectivity and high deposition rates are therefore desirable. A hardmask without sufficient etch resistance may prematurely wear away during the course of etching high aspect ratios thereby resulting in inaccurate and poor pattern transfer.

As feature sizes decrease and aspect ratios increase in semiconductor device applications, hardmasks with increased etch selectivity are needed. Conventional techniques for forming carbon hardmasks with high etch selective are generally achieved by increasing processing temperature and power. However, such techniques for forming hardmasks with high etch selectivity on substrates can cause substrate softening and backside damage which reduce device yield.

Therefore, there is a need in the art for improved methods for depositing carbon hardmasks with high etch selectivity.

SUMMARY

Embodiments of the present disclosure generally relate to the fabrication of integrated circuit. More particularly, in some embodiments, the present disclosure provides techniques for forming high density amorphous carbon films at low temperatures to reduce substrate backside damage. In one embodiment, a method of processing a substrate is provided. The method includes flowing a processing gas comprising a hydrocarbon precursor gas into a processing volume of a process chamber in which the processing volume includes a substrate disposed on a substrate support. The method also includes heating and maintaining the substrate support at a processing temperature of less than about 450° C., and applying a dual radio frequency (RF) power comprising a high frequency RF power and a low frequency RF power to the substrate support to generate and maintain a deposition plasma to deposit a carbon film on the substrate. Then, after depositing the carbon film on the substrate, an annealing process is performed to anneal the carbon film deposited on the substrate.

In another embodiment, a method of processing a substrate is provided. The method includes flowing a processing gas comprising a hydrocarbon precursor gas into a processing volume of a process chamber in which the processing volume includes a substrate disposed on a substrate support. The method also includes heating and maintaining the substrate support at a processing temperature of less than about 450 and applying a dual radio frequency (RF) power comprising a high frequency RF power at about 13.5 MHz and a low frequency RF power at about 385 KHz to the substrate support to generate and maintain a deposition plasma to deposit a carbon film on the substrate. The processing volume is maintained at a processing pressure of about 2.5 Torr or less when depositing the carbon film. The method includes increasing the processing pressure to about 4.5 Torr and decreasing the low frequency RF power to about 0 Watts after the carbon film is deposited. The method also includes performing an annealing process to anneal the carbon film deposited on the substrate.

In a further embodiment, a method of processing a substrate is provided. The method includes flowing a processing gas comprising a hydrocarbon precursor gas into a processing volume of a process chamber through a faceplate of the process chamber. The processing volume includes a substrate disposed on a substrate support comprising a heater, and is defined between the substrate support and the face plate. The method also includes maintaining the processing volume at a processing pressure of about 2.5 Torr or less, and applying a dual radio frequency (RF) power comprising a high frequency RF power and a low frequency RF power to the substrate support to generate a deposition plasma to deposit a carbon film on the substrate. The substrate is maintained at a processing temperature of about 450° C. and the face plate is maintained at a face plate temperature of about 250° C. by the heater when the carbon film is deposited on the substrate. The method includes increasing the processing pressure to about 4.5 Torr and decreasing the low frequency RF power to about 0 Watts after the carbon film is deposited on the substrate at a targeted thickness. The method also includes performing an annealing process at an annealing temperature of about 550° to anneal the carbon film deposited on the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
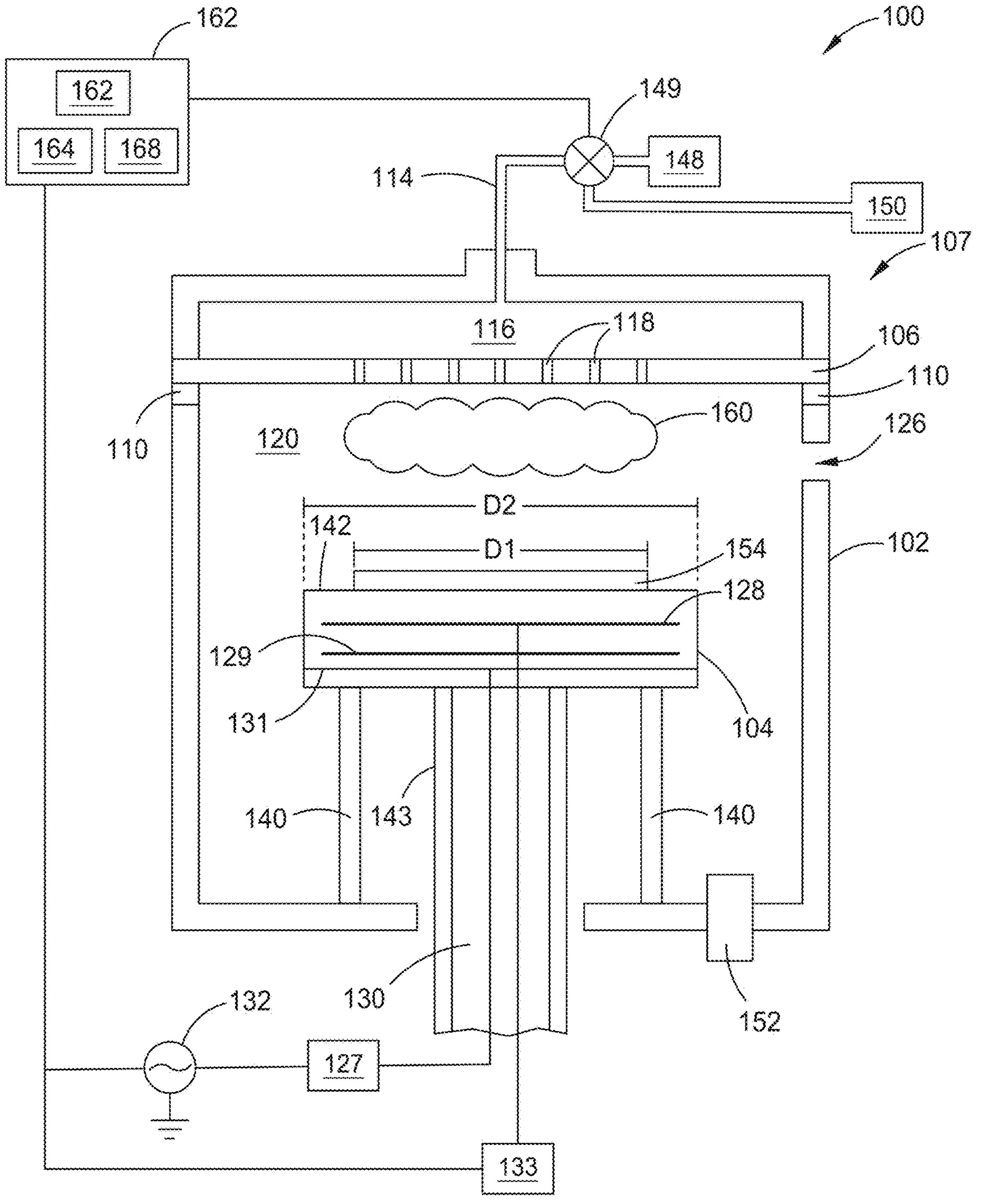
FIG. 1 is a schematic cross-sectional view of a process chamber for performing the methods of the present disclosure, according to certain embodiments.

Methods for depositing an amorphous carbon film directly on or indirectly on a substrate (e.g., on intermediate layers previously formed on the substrate) are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

In some embodiments, the methods described herein utilize a combination of lower processing temperature and dual-frequency RF power with high self-bias and plasma temperature in a PECVD process to deposit an amorphous carbon film with high etch selectivity on a substrate. Conventional processing techniques for forming a carbon hardmask utilize a combination of high processing temperature (e.g., higher than 600° C.) and high power (e.g., greater than 2900 W) to form an amorphous carbon film with high etch selectivity. However, due to a combination of the high chucking force required during processing and wafer expansion from high processing temperatures, backside substrate damage can occur. For example, when forming an amorphous carbon film on a silicon substrate utilizing conventional PECVD techniques, the high processing temperature can cause the silicon substrate to soften and dents to form in the silicon substrate at contact points between the substrate support and the silicon substrate disposed thereon.

In some embodiments, the method of the present disclosure utilizes a lower substrate support temperature during processing (e.g., lower than 450° C.), as compared to conventional processing temperatures for increasing etch selectivity (e.g., higher than 600° C.) to minimize backside damage to the substrate and increase device yield. However, it is estimated that a decrease in processing temperature by about 150° C. may result in about a 0.2 reduction in optical K properties (extinction coefficient) and about a 0.1 reduction in N (refractive index) of the resulting deposited film. As K and N generally correlate with film density, the present disclosure provides alternative avenues for increasing K and/or N to form amorphous carbon films with comparable etch selectivity at lower processing temperatures. In some embodiments, the method also provides for utilizing dual high frequency and low frequency RF power, lower processing pressure, higher plasma temperature, and/or higher self-bias. Each of the foregoing, alone or in combination, may provide for overall higher plasma potential and thus improved density of the amorphous carbon film being deposited without increasing processing temperature. As a result of the overall higher plasma potential and increased densification, the methods described herein provide amorphous carbon films formed at lower processing temperatures that still exhibiting comparable or improved density, rigidity, etch selectivity, and film stress as compared to amorphous carbon films deposited by conventional methods.

FIG. 1 is a schematic cross sectional view of an exemplary processing chamber 100 used to practice the methods set forth herein, according to one embodiment. The process chamber 100 may be a plasma enhanced CVD (PECVD) chamber or other plasma enhanced process chamber.

The process chamber 100 includes a chamber body 102, a substrate support 104 disposed inside the chamber body 102, and a lid assembly 107 coupled to the chamber body 102 and enclosing the substrate support 104 in a processing volume 120. The lid assembly 107 includes a faceplate 106 comprising a gas distributor, such as a showerhead. Substrate 154 may be provided to the processing volume 120 through an opening 126 formed in the chamber body 102. Faceplate 106 may at least partially define the processing volume 120 from above, which may at least partially cooperate with the substrate support 104 in a raised position to generally define the processing volume 120.

An isolator 110, which may be a dielectric material such as a ceramic or metal oxide, for example aluminum oxide and/or aluminum nitride, separates the faceplate 106 from the chamber body 102. The faceplate 106 includes openings 118 for admitting processing gases or cleaning gases into the processing volume 120. Processing gases may be supplied from a gas source 148, through a mass flow controller 149 into the process chamber 100 via a conduit 114. The gases may enter a gas mixing region 116 prior to flowing through the openings 118. In some embodiments, radicals for cleaning the processing volume 120 may be provided by a remote plasma source 150. An exhaust 152 is formed in the chamber body 102 at a location below the substrate support 104. The exhaust 152 may be connected to a vacuum pump (not shown) to remove unreacted species and by-products from the process chamber 100.

The substrate support 104 includes a surface 142 for supporting the substrate 154. The substrate 154 has a dimension D1 (e.g., a diameter), and the substrate support 104 has a dimension D2 (e.g., a diameter), that may be greater than the dimension D1. The substrate support 104 may be formed from a ceramic material, for example a metal oxide or nitride or oxide/nitride mixture such as aluminum, aluminum oxide, aluminum nitride, or an aluminum oxide/nitride mixture. The substrate support 104 is supported by a shaft 143. The substrate support 104 may be grounded. A heating element 128 and a bias electrode 129 may be embedded in the substrate support 104. In some embodiments, the bias electrode 129 may also be a chucking electrode. The heating element 128 may be a plate, a perforated plate, a mesh, a wire screen, or any other distributed arrangement. The heating element 128 can be connected to a heating power source 133 and can heat the substrate 154 to an elevated temperature, such as from about 200 degrees Celsius to about 450 degrees Celsius, or more.

In some embodiments, the substrate support 104 may also include a single electrically conductive rod (referred to as an "RF rod") 130 disposed within at least a portion of the shaft 143 that is coupled to the substrate support 104. In some embodiments, the RF rod 130 extending through the shaft 143 couples the bias electrode 129 to an RF power source 132 through a match 127. In some embodiments, the RF power source 132 provides an RF current to the bias electrode 129 to deliver a RF bias power to the substrate support 104 and the substrate disposed thereon. The RF bias power from the RF power source 132 acts to energize (or "excite") the processing gases in the processing volume 120 into a bias plasma 160 to, for example, form an amorphous carbon film on a surface of the substrate 154 in the processing volume 120. When exposed to plasma 160, constituents from the processing gases, including ions, neutrons, protons, and radicals are created when the processing gases may be disassociated by the application of RF generator or DC power source.

In some embodiments, the RF power source 132 may be a high frequency RF power source with a frequency between about 1 MHz and about 60 MHz for example, and in a particular embodiment, is in the 13.56 MHz band. In other embodiments, the RF power source 132 may be a dual-frequency RF power source, providing low and high frequency, such as a low frequency of 250 kHz, 385 kHz, 2 MHZ, or 400 KHz frequency power in combination with a 13.56 MHz frequency power. During a deposition process, the RF power source 132 may provide a RF power between about 1,000 Watts (W) to about 10,000 W in the processing volume 120 to facilitate ionization of a precursor gas and generation of a plasma.

In some embodiments, which can be combined with other embodiments described herein, during deposition, the RF power source 132 provides a high frequency power (e.g., 13.5 MHz) between about 1,000 Watts and about 6,000 Watts, such as about 3000 Watts. In some embodiments, which can be combined with other embodiments described herein, during deposition, the RF power source 132 provides a low frequency RF power (e.g., about 385 kHz) between about 0 Watt and about 1500 Watts, such as about 900 Watts. In some embodiments, without being bound by theory, it is believed when low frequency RF power is delivered by the RF power source 132 in conjunction with high frequency RF power for plasma generation, an increased plasma density may be produced and maintained despite processing occurring at a low pressure, such as about 2.5 Torr, and low processing temperature, such as about 450° C.

In some embodiments, to increase margins for an elevated RF processing regimes, for example for the delivery of up to about 6,000 Watts RF Power at about 13.5 MHz, the shaft 143 and/or the RF rod 130 may be configured with a larger RF connector to improve stability of RF delivery from the RF power source 132 and repeatability of the process. In some embodiments, the shaft 143 may be configured with a plurality of individual shunt capacitors to increase current carrying capacity for providing high RF current. In some embodiments, such configurations for the elevated RF processing regime provide for maintaining high plasma density even at low pressures, such as less than about 1 Torr, thereby preventing the need for additional inductively coupled plasma (ICP) or very high frequency (VHF) source components. In some embodiments, the foregoing configuration for providing a high power bottom RF feed to the substrate support 104 in turn provides a higher bias on the substrate side and a longer ion mean free path. Such configurations result in increases of carbon ion energy as well as the maintaining of high ion density and high power density. In some embodiments, critical components for RF delivery are further optimized with composite coating to prevent degradation or corrosion in response to high temperatures from the high RF power being delivered and improve reliability.

In some embodiments, the RF rod 130 may alternatively comprise dual RF rods (not shown) for coupling the bias electrode 129 to the RF power source 132. Use of the dual RF rods to transmit the RF current from the RF power source 132 can assist in preventing overheating from the delivery of the high RF current. Dual RF rods divide the RF current provided by the RF power source 132 to the bias electrode 129 into the two RF rods and thus prevents overheating by reducing the Joule heating (e.g., $I^2R$ heating) at each of the dual RF rods. Use of dual RF rods may also result in a more uniform temperature distribution across the substrate support 104, which in turn may translate into, for example, a more uniformly deposited amorphous carbon film across the substrate 154.

In some embodiments, the support member 104 is displaceable in the vertical direction. For example, a baffle 140 connected between the support member 104 and the chamber body 102 may extend and contract to allow for vertical movement of the support member 104. During operation, the substrate support 104 may raise to a higher position towards the faceplate 106 thereby decreasing a volume of the processing volume 120 between the surface 142 of the substrate support 104 and the faceplate 106. Elevating the substrate support 104 to the higher position for processing the substrate 154 in a processing environment with a smaller volume may assist in providing enhanced plasma density uniformity in the processing volume 120 during processing. In some embodiments, during a cleaning process, a cleaning gas is flowed into the process chamber 100 for cleaning the processing volume 120. As such, confining the deposition process to a smaller volume in turn also allows for shorter clean times that can translate into increased throughput by the process chamber 100.

At least one controller 162 is coupled to the process chamber 100. The controller 162 includes a processor 164, a memory 166, and support circuits 168 that are coupled to one another. The processor 164 may be one of any form of general purpose microprocessor, or a general purpose central processing unit (CPU), each of which can be used in an industrial setting, such as a programmable logic controller (PLC), supervisory control and data acquisition (SCADA) systems, or other suitable industrial controller. The memory 166 is non-transitory and may be one or more of readily available memory such as random access memory (RAM), read only memory (ROM), or any other form of digital storage, local or remote. The memory 166 contains instructions, that when executed by the processor 164, facilitates execution of the method 300 (described below). The instructions in the memory 166 are in the form of a program product such as a program that implements the method of the present disclosure.

The program code of the program product may conform to any one of a number of different programming languages. Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

Figure 2:
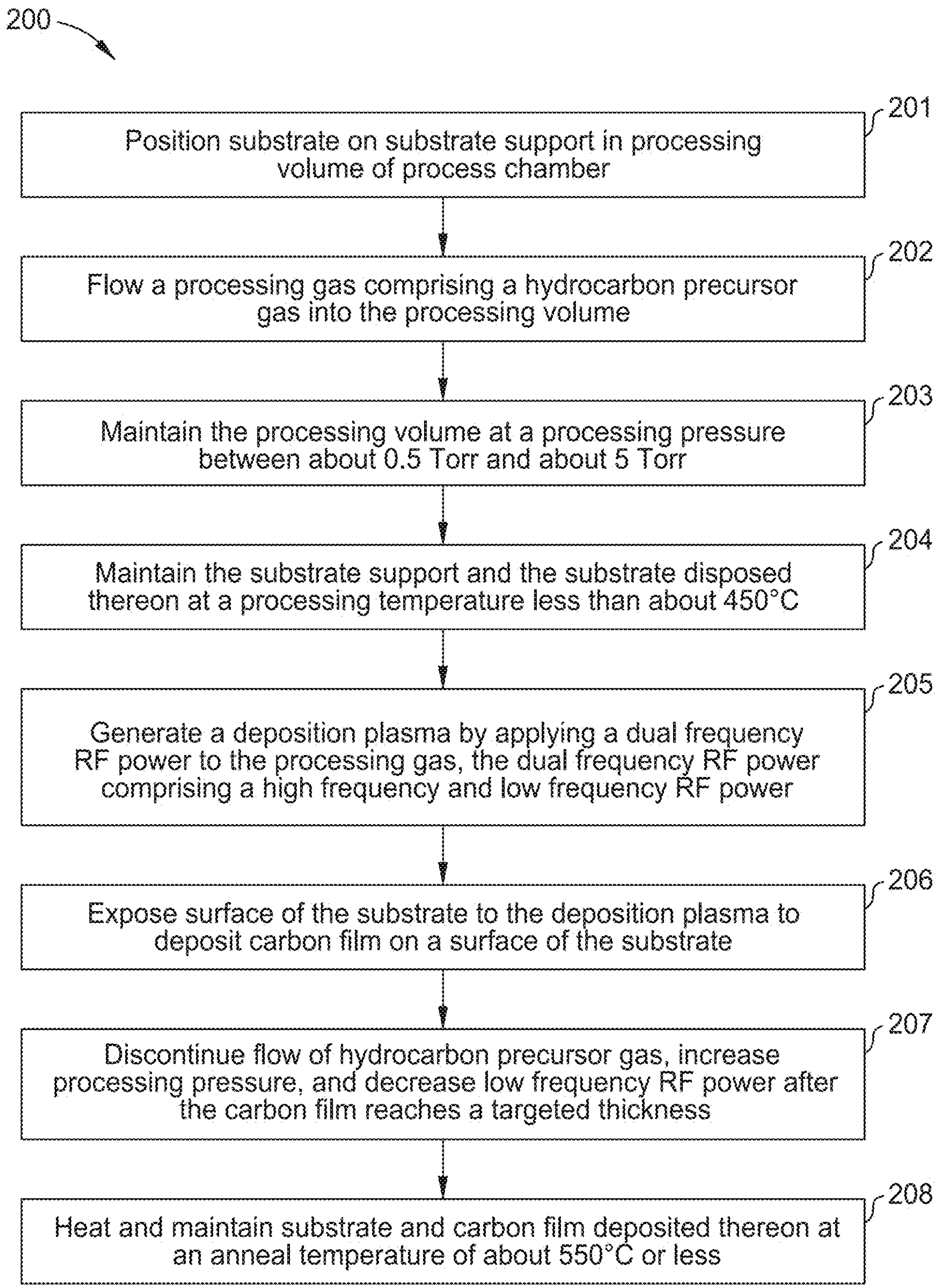
FIG. 2 depicts a process flow diagram of a method for forming an amorphous carbon film, according to certain embodiments.

FIG. 2 is a flow diagram of a method 200 of depositing an amorphous carbon film on a surface of a substrate, according to one embodiment. At operation 201 the method 200 includes positioning a substrate on a substrate support disposed in a processing volume of a process chamber, such as the process chamber 100 depicted in FIG. 1. In certain embodiments, the substrate may be any substrate or material surface upon which film processing is performed. For example, the substrate may comprise a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof. In some embodiments, the substrate support comprises a plurality of heater dimples in contact with a backside of the substrate for heating the substrate during processing.

At operation 202, the method 200 includes flowing a processing gas from a gas source into the processing volume. The processing gas may be flowed from the gas source into the processing volume through the gas distribution faceplate. In an embodiment, the processing gas includes a hydrocarbon precursor gas, for example $C_2H_2$, $C_3H_6$, or combinations thereof, for providing a precursor species. In another embodiment, the processing gas may also include a dilution gas, for example an inert gas such as helium (He), argon (Ar), hydrogen ($H_2$), nitrogen ($N_2$), ammonia ($NH_3$), nitrogen oxide ($N_2O$), or combinations thereof. In an embodiment, the dilution gas may be flowed In some embodiments, a flowrate of the hydrocarbon precursor gas is between about 200 sccm and about 600 sccm. For example, in some embodiments, a flow rate of $C_2H_2$ is between about 200 sccm and about 600 sccm, or between about 250 sccm and about 550 sccm, or between about 300 sccm and about 450 sccm, or between about 350 sccm and about 500 sccm, or about 400 sccm. In some embodiments, a flowrate of the dilution gas is between about 0 sccm and about 6600 sccm. For example, in an embodiment, a flowrate of a helium dilution gas is between about 0 sccm and about 1000 sccm. In another embodiment, a flow rate of an argon dilution gas is between about 3300 sccm and about 6600 sccm. In some embodiments, no dilution gas may be used.

At operation 203, the method 200 includes maintaining the processing volume at a processing pressure between about 0.5 Torr and about 5 Torr, such as between about 0.5 Torr and about 3 Torr, or between about 1 Torr and about 3.5 Torr, or between about 2 Torr and about 4 Torr, or about 3.5 Torr and less, or about 2.5 Torr and less.

At operation 204 the method 200 includes heating and maintaining the substrate support with the substrate disposed thereon at a processing temperature between about 350° C. and about 475° C., such as between about 375° C. and about 460° C., such as between about 400° C. and about 450° C., such as about 450° C., or less than about 450° C.

Figure 5:
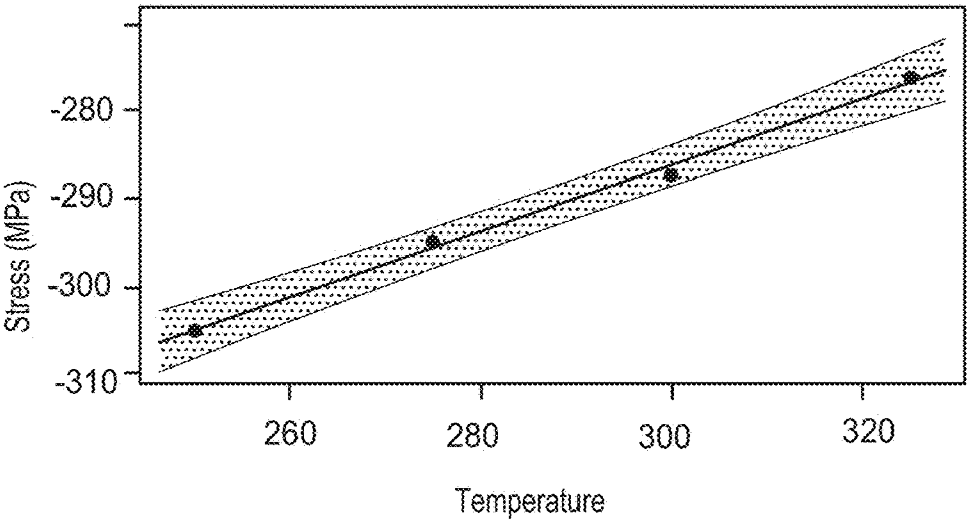
FIG. 5 shows a graph illustrating the effect on film stress of amorphous carbon films formed with face plates at varying processing temperatures, according to certain embodiments.

FIG. 5 shows a graph of in film stress as a function of faceplate temperature. As mentioned above, the process kit temperature of the process chamber may be modified to control the faceplate temperature during processing. In some embodiments, when the substrate is heated by the substrate support to the low processing temperatures described herein, the faceplate 106 disposed above the substrate and the processing volume may be at a lower temperature, such as less than about 320° C., or less than about 300° C., or less than about 280° C., or about 250° C. As shown in FIG. 5, increasing faceplate temperature desirably reduces the compressive film stress of the as deposited amorphous carbon film.

At operation 205, the method 200 continues with generating and maintaining a deposition plasma by applying a dual-frequency RF power to the processing gas. Dual frequency RF power application is believed to provide control of flux and ion energy to in turn compensate for the decreased processing temperature and improve etch selectivity since it is believed that the energy of the ions hitting the film surface influences the film density. Specifically, it was observed that the high frequency RF power provides control to increase plasma density and low frequency RF power provides control to increase the bombardment energy of the ions hitting the substrate surface.

The dual-frequency RF power may be applied using a dual-frequency source of mixed RF power. In some embodiments, the dual-frequency RF power comprises applying a high frequency RF power in a range from about 10 MHz to about 30 MHz, for example, about 13.56 MHz. In an embodiment, the power application of high frequency RF power may be from about 2500 W to about 3300 W, for example, about 3000 W. In some embodiments, the dual-frequency RF power comprises applying a low frequency RF power in a range of from about 10 KHz to about 1 MHz, for example, about 385 KHz. In an embodiment, the power application of low frequency RF power may be from about 600 W to about 1200, such as between about 800 W and about 1000 W, for example, about 900 W. In an embodiment, when dual-frequency RF power is used to deposit the amorphous carbon film, the ratio of the low frequency RF power to the total mixed frequency power is preferably less than about 0.4 to 1.0 (0.4:1). In an embodiment, the applied RF power and frequencies used may be varied based upon the substrate size and the equipment used.

It was observed that a hotter bias or deposition plasma increases ion energy density and ion bombardment which can compensate for the lower processing temperature and increase the density of the deposited amorphous carbon film. Specifically, a high cathode-to-anode ratio may be utilized to increase and achieve a high self-bias which in turn increases overall bombardment of ions on the deposited film and thus increased density of the deposited film without affecting the temperature of the substrate. In addition, it is also believed that from the perspective of increasing energy density, reducing processing pressure in turn increases electron temperature at the surface of the substrate which increases the overall plasma potential resulting in a hotter plasma for depositing the amorphous carbon film with high selectivity while maintaining a lower substrate temperature during processing. In another embodiment, the process chamber may also be outfitted with a higher process kit temperature so as to modify the faceplate temperature during processing and provide additional densification benefit for the deposited film by reducing film stress. For example, in an embodiment, a temperature of the gas distributor of the faceplate 106 can be between about 250° C. and about 325° C. Without being bound by theory, it was observed a higher process kit temperature or increasing a temperature of the faceplate 106 may assist in reducing radiation thermal loss during processing. When combined with the increased self-bias from the high cathode-to-anode ratio, the foregoing may assist in increasing the temperature of the bias or deposition plasma during processing.

From an ion bombardment perspective, increased energy density or plasma power leads to generation of a thicker plasma sheath, generally located between a plasma body of the deposition plasma and the substrate where only positive ions and radicals are formed due to electron depletion. This may in turn further support the mechanism of increasing ion energy density from the ion bombardment perspective, since due to a greater concentration of ions being in the plasma body and plasma sheath, higher energy density would improve the overall RF power distribution per ion.

Figure 3:
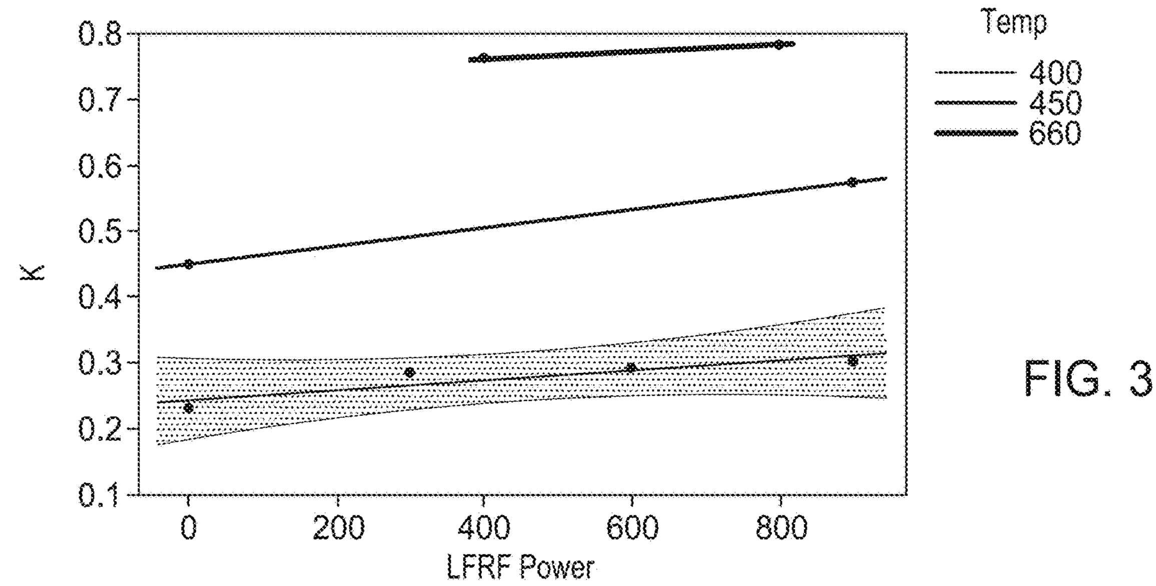
FIG. 3 shows a graph comparing the optical K properties (extinction coefficient) of amorphous carbon films formed at varying processing temperatures as a function of applied low frequency RF power, according to certain embodiments.

FIG. 3 shows a graph of the optical K properties (extinction coefficient) for amorphous carbon films formed at 400° C., 450° C., and 660° C. as a function of applied low frequency RF power. In addition to increasing the overall power received per ion, the addition of the low frequency RF power desirably improves optical K properties (extinction coefficient) of the resulting film formed at low processing temperatures (e.g., 400-450° C.) which in turn leads to lower H % and increased etch selectivity.

Figure 4:
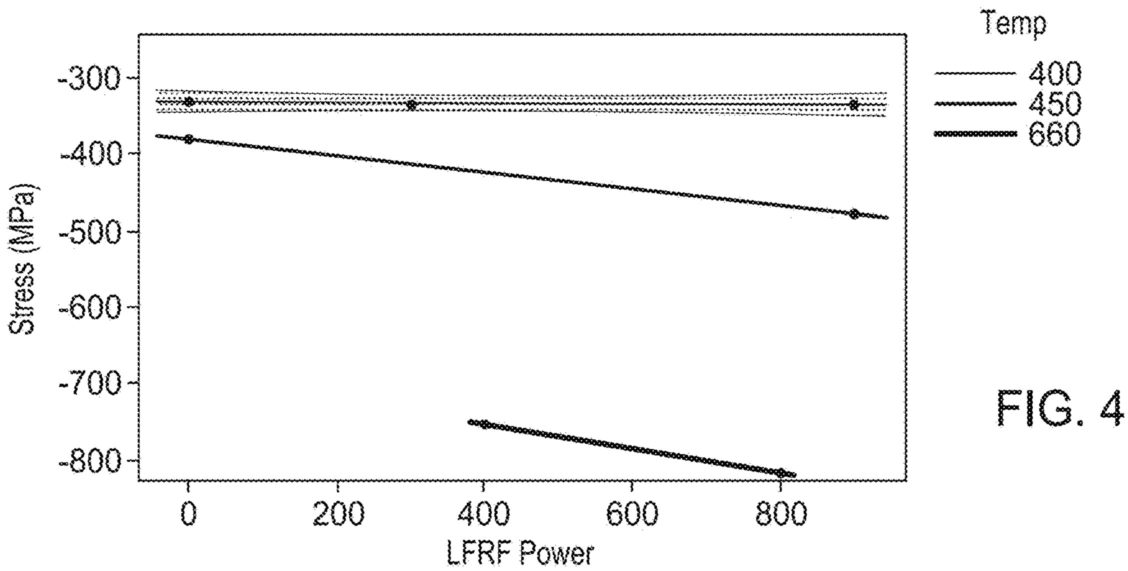
FIG. 4 shows a graph comparing film stress of amorphous carbon films at varying processing temperatures as a function of applied low frequency RF power, according to certain embodiments.

Furthermore, the addition of the low frequency RF power may also desirably reduce film stress of the as deposited amorphous carbon film formed at low processing temperatures (e.g., 400-450° C.). FIG. 4 shows a graph of film stress of amorphous carbon films formed at 400° C., 450° C., and 660° C. as a function of low frequency RF applied. As can be seen from the graph in FIG. 4, the impact of low frequency RF power on film stress dramatically increases when the processing temperature is increased from 400° C. to 450° C.

At operation 206, the method 200 includes exposing a surface of the substrate to the deposition plasma to deposit an amorphous carbon film on a surface of the substrate. In some embodiments, the deposition plasma is maintained for a time period to deposit an amorphous carbon film having a thickness between about 500 Å and about 70,000 Å. The flow of processing gas is continued until a targeted thickness of the amorphous carbon film is reached.

In an embodiment, immediately after the deposition phase of operation 206, which may be stopped by discontinuing the flow of the hydrocarbon precursor species, method 200 may continue with operation 207 in which the plasma is maintained with different processing parameter values compared to the previous deposition step. For example, in operation 207, within about 2 seconds after the amorphous carbon film is formed in operation 206 at the targeted thickness, the processing pressure in the processing volume is increased, and the low frequency RF power applied is decreased. In an embodiment, operation 207 may also include discontinuing the flow of the hydrocarbon precursor gas. In an embodiment, increasing the processing pressure and reducing and/or ceasing the application of low frequency RF power may assist in avoiding surface defects in the form of fall on particles. In an embodiment, the low frequency RF power is reduced to 0 Watts. In an embodiment, the processing pressure may be increased up to about 5 Torr or less. In some embodiments, the processing pressure may be increased to about 4.5 Torr.

In another embodiment, one or more inert gas species may additionally be supplied to the ambient in operation 207. In addition to the deposition plasma, the additional one or more inert gas species may reduce the probability of any interaction with exposed surfaces while also promoting removal of any reactive components which may still be present in the ambient.

At operation 208, the method 200 includes heating and maintaining the substrate and the amorphous carbon film deposited thereon at an anneal temperature of about 550° C. or less, such as between about 400° C. and about 550° C., between about 425° C. and about 525° C., between about 450° C. and about 500° C., for example between about 475° C. and about 500° C. In some embodiments, when the substrate is heated by the substrate support to the anneal temperature, the faceplate disposed above the substrate and the processing volume may be at a lower temperature, such as about 250° C.

In operation 208, the substrate and the amorphous carbon film deposited thereon are maintained at the anneal temperature for about 4 hours or more, such as between about 4 hours and about 6 hours, between about 4.5 hours and about 5.5 hours, such as for example, about 5 hours. In an embodiment, the annealing process of operations 208 and 209 may be performed with the same process chamber utilized for the deposition process of the amorphous carbon film in operation 206. In other embodiments, a different anneal chamber may be used for performing operations 208 and 209.

While FIG. 2 illustrates one example of a flow diagram, it is to be noted that variations of method 200 are contemplated. For example, it is contemplated that operation 204 may occur prior to operation 202 or 203. Additionally, it is contemplated that one or more of operations 202-206 may occur concurrently.

In some embodiments, the method 200 further includes depositing a patterning layer on the amorphous carbon film. Herein, the patterning layer may be deposited in a different deposition chamber than the deposition chamber used to deposit the amorphous carbon film. Typically, the patterning layer comprises silicon oxide, silicon nitride, amorphous silicon, or a combination thereof. In some embodiments, the deposition chamber used to deposit the amorphous carbon film and the deposition chamber used to deposit the patterning layer are part of the same multi-chamber processing system (i.e., cluster tool). In some embodiments, the method 200 further includes forming a plurality of openings through the patterning layer using conventional lithography and etch processes. The plurality of openings in the patterning layer are then extended through the amorphous carbon film to form a patterned carbon hardmask. The plurality of openings may also be further extended through to the underlying material or substrate below the patterned carbon hardmask.

A comparison between target film properties of amorphous carbon films formed at 400° C. and 450° C. utilizing the methods described herein, as well as conventional high temperature carbon film formed at 630° C. (reference) is provided below in Table 1. Generally, K and N correlate with film density. Higher film densities in amorphous carbon hard masks desirably result in increased etch selectivity. As shown, the carbon film formed at 400° C. had a lower K and N which resulted in a lower density and reduced etch selectivity as compared to reference. However, the amorphous carbon film formed at 450° C. resulted in film properties substantially similar to the reference film formed at 630° C. and exhibit improved etch selectivity as compared to the reference, indicating that the methods described herein at 450° C. can be used to form amorphous carbon films with etch selectivity similar to or better than conventional carbon films formed at higher temperatures.

TABLE 1

| Film Properties | Reference Carbon Film | Low Temperature Carbon Film #1 | Low Temperature Carbon Film #2 |
|---|---|---|---|
| Temperature (° C.) | 630 | 400 | 450 |
| Thickness (Å) | 3853 | 3578 | 3884 |
| K (633 nm) @ 3.5 kÅ | .614 | .235 | .638 |
| N (633 nm) @ 3.5 kÅ | 2.07 | 1.98 | 2.07 |
| H % | 13.5 | 17 | 14 |
| Film Density (g/cc) | 1.7 | 1.46 | 1.72 |
| Modulus (GPa) | 43/6.2 | 30.4/4.4 | 67/9.5 |
| 38 kA film stress (MPa) | NA | −50 | −159 |
| Blanket etch selectivity improvement | 1x | .9x | 1.1x |

As discussed above, heating and maintaining the substrate support and the substrate disposed thereon at a lower processing temperature, as compared to conventional higher processing temperatures (e.g., higher than 600° C.), minimizes or prevents backside damage from occurring on the substrate and increases device yield. In an embodiment, it was observed that at lower temperatures, such as about 400° C., the hardness of the silicon substrate during processing remains high and stable such that wafer expansion is low enabling the substrate to resist against backside damage, for example, dimple dents caused by the substrate support.

Figure 6A:
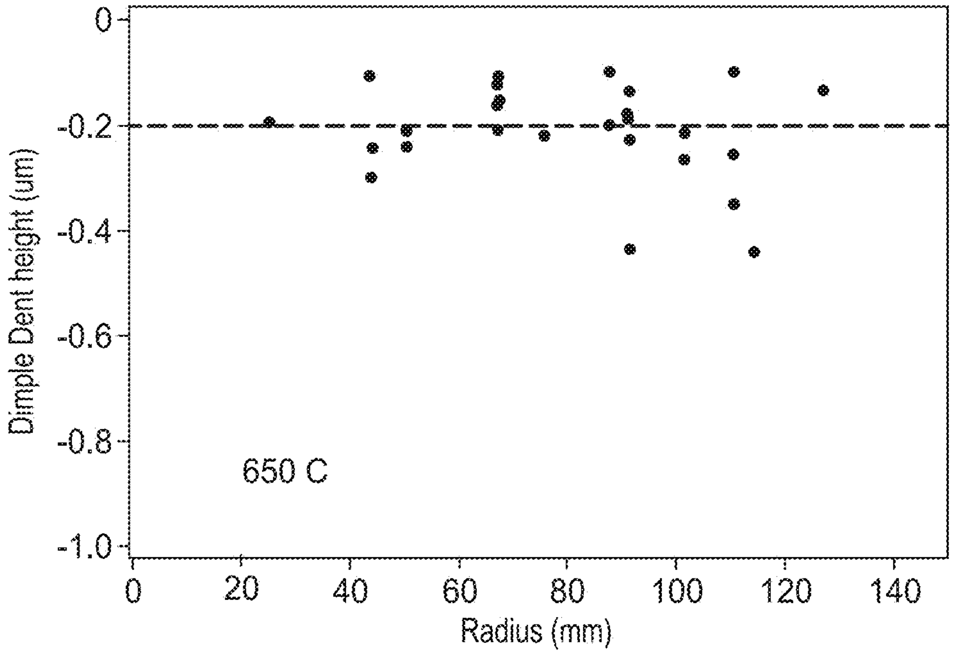
FIGS. 6A and 6B show graphs of the extent and distribution of substrate backside damage at high and low processing temperatures, according to certain embodiments.
Figure 6B:
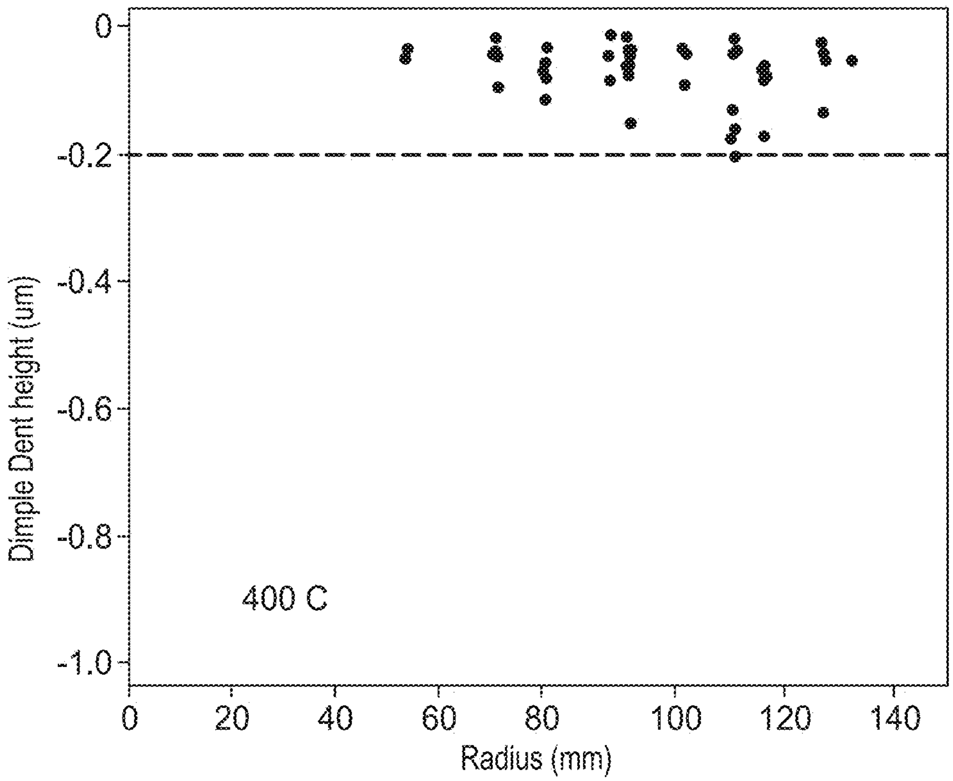

FIGS. 6A and 6B compare the extent of dimple dent depth (backside damage) in a silicon substrate and distribution thereof with respect to substrate radius between a silicon substrate processed at about 400° C. and a reference substrate processed at about 650° C. As shown in FIG. 6A, processing at about 650° C. lead to substrate backside damage with dimple dent depths of >0.2 um. In contrast, by decrease processing temperature to about 400° C., dimple dent depths were minimized at ≤0.2 μm, as shown in FIG. 6B. Accordingly, depositing amorphous carbon films on substrates at lower processing temperature decreases the extent of substrate backside damage and therefore increases device yield during processing.

Thus, methods for forming a highly etch selective amorphous carbon film at low processing temperatures are provided by a plasma deposition process according to embodiments described herein. The present disclosure advantageously provides an amorphous carbon film with targeted mechanical properties substantially similar to the properties of carbon films formed at high processing temperatures, resulting in comparative etch selectivity. In some embodiments, the methods provide for utilizing dual high frequency and low frequency RF power, lower processing pressure, higher plasma temperature, and/or higher self-bias to form a comparable amorphous carbon film at low processing temperatures. The resulting amorphous carbon hardmask formed according to the present disclosure exhibit significantly less backside damage without sacrificing utility (e.g., etch selectivity) as compared to carbon hardmask films formed using conventional techniques, thereby also increasing device yield.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, comprising:

flowing a processing gas comprising a hydrocarbon precursor gas into a processing volume of a process chamber having a substrate disposed on a substrate support;

heating and maintaining the substrate support at a processing temperature between about 400° C. and about 450° C.;

applying a dual radio frequency (RF) power comprising a high frequency RF power and a low frequency RF power to the substrate support to ignite the processing gas flowing into the processing volume and generate a deposition plasma, wherein the processing volume is maintained at a processing pressure of about 2.5 Torr or less;

depositing a carbon film on the substrate using the deposition plasma in a chemical vapor deposition process; and performing an annealing process to anneal the carbon film deposited on the substrate.

2. The method of claim 1, further comprising maintaining the processing volume at a processing pressure between about 0.7 Torr and about 1 Torr when depositing the carbon film.

3. The method of claim 1, further comprising maintaining the processing volume at a processing pressure of about 2.5 Torr or less when depositing the carbon film.

4. The method of claim 1, wherein applying the high frequency RF power comprises applying RF power having a frequency between about 12.8 MHz and about 14.7 MHz at a power of about 3000 W.

5. The method of claim 1, wherein applying the low frequency RF power comprises applying RF power having a frequency between about 345 KHz and about 385 KHz at a power of about 900 W.

6. The method of claim 1, further comprising increasing the processing pressure to about 4.5 Torr within about 2 seconds after the carbon film is deposited on the substrate at a targeted thickness.

7. The method of claim 1, further comprising reducing the low frequency RF power to about 0 W within about 2 seconds after the carbon film is deposited on the substrate.

8. The method of claim 1, wherein the hydrocarbon precursor gas comprises $C_2H_2$ or $C_3H_6$.

9. The method of claim 1, wherein the processing gas further comprises a dilution gas comprising helium (He), argon (Ar), hydrogen ($H_2$), nitrogen ($N_2$), ammonia ($NH_3$), nitrogen oxide ($N_2O$), or combinations thereof.

10. The method of claim 1, wherein flowing the processing gas comprises flowing the hydrocarbon precursor gas at a flow rate between about 200 sccm and about 600 sccm.

11. The method of claim 1, wherein flowing the processing gas comprises flowing helium at a flow rate between about 0 sccm and about 1000 sccm, and flowing argon at a flow rate between about 3300 sccm and about 6600 sccm.

12. The method of claim 1, wherein anneal process comprises annealing the carbon film at an anneal temperature of about 550° C. or less.

13. The method of claim 12, wherein the anneal process comprising maintaining the carbon film at the anneal temperature for about 5 hours.

14. The method of claim 1, wherein when the deposition plasma is generated in the processing volume between the substrate support comprising a heater and a face plate, wherein the face plate is disposed at a distance between about 400 mils and about 800 mils from the substrate support.

15. The method of claim 14, further comprising setting a faceplate temperature of the faceplate to between is about 250° C. and about 325° C. when depositing the carbon film on the substrate.

16. A method of processing a substrate, comprising:

flowing a processing gas comprising a hydrocarbon precursor gas into a processing volume of a process chamber having a substrate disposed on a substrate support;

heating and maintaining the substrate support at a processing temperature between about 400° C. and about 450° C.;

applying a dual radio frequency (RF) power comprising a high frequency RF power at about 13.5 MHz and a low frequency RF power at about 385 KHz to the substrate support to ignite the processing gas flowing into the processing volume and generate a deposition plasma for depositing a carbon film on the substrate using a chemical vapor deposition process, wherein the processing volume is maintained at a processing pressure of about 2.5 Torr or less when depositing the carbon film;

increasing the processing pressure to about 4.5 Torr and decreasing the low frequency RF power to about 0 Watts after the carbon film is deposited on the substrate at a targeted thickness; and performing an annealing process to anneal the carbon film deposited on the substrate, wherein the carbon film comprises a film density of at least about 1.7 g/cc after the carbon film is annealed.

17. The method of claim 16, wherein the hydrocarbon precursor gas comprises $C_2H_2$ or $C_3H_6$.

18. The method of claim 16, wherein applying the dual radio frequency (RF) power comprises applying about a mixed RF power at about 4000 Watts.

19. A method of processing a substrate, comprising:

flowing a processing gas comprising a hydrocarbon precursor gas through a face plate into a processing volume of a process chamber having a substrate disposed on a substrate support comprising a heater, wherein the processing volume is defined between the substrate support and the face plate;

maintaining the processing volume at a processing pressure of about 2.5 Torr or less;

applying a dual radio frequency (RF) power comprising a high frequency RF power and a low frequency RF power to the substrate support to ignite the processing gas flowing into the processing volume and generate a deposition plasma for depositing a carbon film on the substrate using a chemical vapor deposition process, wherein the substrate is maintained at a processing temperature of about 450° C. by the heater and the face plate is maintained at a face plate temperature of about 250° C. when the carbon film is being deposited on the substrate;

increasing the processing pressure to about 4.5 Torr and decreasing the low frequency RF power to 0 Watts within about 2 seconds after the carbon film is deposited on the substrate at a targeted thickness; and performing an annealing process at an annealing temperature of about 550° C. to anneal the carbon film deposited on the substrate.

20. The method of claim 19, wherein the face plate is disposed at a distance between about 400 mils and about 800 mils from the substrate support.

* * * * *